US009229324B2

(12) United States Patent
Singh et al.

(10) Patent No.: US 9,229,324 B2
(45) Date of Patent: Jan. 5, 2016

(54) METHODS OF PROVIDING PATTERNED TEMPLATES FOR SELF-ASSEMBLABLE BLOCK COPOLYMERS FOR USE IN DEVICE LITHOGRAPHY

(71) Applicant: ASML Netherlands B.V., Veldhoven (NL)

(72) Inventors: Harmeet Singh, Eindhoven (NL); Vadim Yevgenyevich Banine, Deurne (NL); Jozef Maria Finders, Veldhoven (NL); Sander Frederik Wuister, Eindhoven (NL); Roelof Koole, Eindhoven (NL); Emiel Peeters, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/385,047

(22) PCT Filed: Mar. 6, 2013

(86) PCT No.: PCT/EP2013/054502
§ 371 (c)(1),
(2) Date: Sep. 12, 2014

(87) PCT Pub. No.: WO2013/143813
PCT Pub. Date: Oct. 3, 2013

(65) Prior Publication Data
US 2015/0034594 A1    Feb. 5, 2015

Related U.S. Application Data

(60) Provisional application No. 61/616,880, filed on Mar. 28, 2012.

(51) Int. Cl.
*G03F 7/16* (2006.01)
*G03F 7/038* (2006.01)
(Continued)

(52) U.S. Cl.
CPC .............. *G03F 7/162* (2013.01); *B82Y 10/00* (2013.01); *B82Y 40/00* (2013.01); *G03F 7/0002* (2013.01);
(Continued)

(58) Field of Classification Search
CPC .......... G03F 7/038; G03F 1/22; G03F 7/2022; G03F 7/004; H01L 21/027; H01L 21/0274; H01L 21/0337; H01L 21/0338
See application file for complete search history.

(56) References Cited

U.S. PATENT DOCUMENTS 7,521,094 B1 *   4/2009  Cheng et al. ................. 427/532
2003/0232257 A1  12/2003 Inao et al.
(Continued)

FOREIGN PATENT DOCUMENTS

WO    2011/080016    7/2011
WO    2012/084558    6/2012
WO    2013/010730    1/2013

OTHER PUBLICATIONS

International Search Report mailed Jul. 5, 2013 in corresponding International Patent Application No. PCT/EP2013/054502.
(Continued)

*Primary Examiner* — Duy Deo
(74) *Attorney, Agent, or Firm* — Pillsbury Winthrop Shaw Pittman LLP

(57) ABSTRACT

A method is disclosed to form a patterned template on a substrate, to direct orientation of a self-assemblable block copolymer. The method involves providing a resist layer of a positive tone resist on the substrate and overexposing the resist with actinic (e.g. UV) radiation by photolithography to expose a continuous region of the resist layer with a sub-resolution unexposed resist portion at the interface between the resist and the substrate. The resist portion remaining at the interface, after removal of the exposed region, provides a basis for a chemical epitaxy template. The method may allow for simple, direct photolithography to form a patterned chemical epitaxy template and optionally include an accurately co-aligned graphoepitaxy feature and/or a substrate alignment feature.

22 Claims, 8 Drawing Sheets

(51) Int. Cl.
  *G03F 7/00* (2006.01)
  *G03F 7/20* (2006.01)
  *B82Y 10/00* (2011.01)
  *B82Y 40/00* (2011.01)
  *G03F 7/30* (2006.01)
  *G03F 7/40* (2006.01)
  *H01L 21/027* (2006.01)

(52) U.S. Cl.
  CPC .............. G03F 7/038 (2013.01); G03F 7/165 (2013.01); G03F 7/2022 (2013.01); G03F 7/2024 (2013.01); G03F 7/30 (2013.01); G03F 7/40 (2013.01); H01L 21/027 (2013.01)

(56) References Cited

U.S. PATENT DOCUMENTS

| | | |
|---|---|---|
| 2007/0082279 A1 | 4/2007 | Mizutani et al. |
| 2008/0248432 A1 | 10/2008 | Terao et al. |
| 2009/0311633 A1 | 12/2009 | Ito |
| 2010/0297847 A1 | 11/2010 | Cheng et al. |
| 2011/0147983 A1 | 6/2011 | Cheng et al. |
| 2015/0050599 A1* | 2/2015 | Wuister et al. ................ 430/323 |

OTHER PUBLICATIONS

Vadakke Matham Murukeshan et al., "Modeling of subwavelength resist growing features fabricated by evanescent waves interference," Optical Engineering, vol. 47, No. 12, pp. 129001-1-129001-9 (Dec. 2008).

Seong-Jun Jeong et al., "Soft Graphoepitaxy of Block Copolymer Assembly with Disposable Photoresist Confinement," Nano Letters, vol. 9, No. 6, pp. 2300-2305 (2009).

Joy Y. Cheng et al., "Simple and Versatile Methods to Integrate Directed Self-Assembly with Optical Lithography Using a Polarity-Switched Photoresist," ACS Nano, vol. 4, No. 8, pp. 4815-4823 (2010).

Miri Park et al., "Block Copolymer Lithography: Periodic Arrays of ~$10^{11}$ Holes in 1 Square Centimeter," Science, vol. 276, pp. 1401-1404 (May 30, 1997).

Seung Hak Park et al., "Block copolymer multiple patterning integrated with conventional ArF lithography," Soft Matter, vol. 6, pp. 120-125 (2010).

* cited by examiner

METHODS OF PROVIDING PATTERNED TEMPLATES FOR SELF-ASSEMBLABLE BLOCK COPOLYMERS FOR USE IN DEVICE LITHOGRAPHY

CROSS-REFERENCE TO RELATED APPLICATIONS

This application is the U.S. national phase entry of PCT patent application no. PCT/EP2013/054502, which was filed on Mar. 6, 2013, which claims the benefit of priority of U.S. Provisional Application No. 61/616,880, which was filed on Mar. 28, 2012, which is incorporated herein in its entirety by reference.

FIELD

The present invention relates to a method of forming a patterned template to direct self-assembly of a polymer on a surface of a substrate. The invention also relates to formation of a self-assembled polymer layer on such a substrate and a method for device lithography using a resist layer of self-assembled polymer deposited and assembled on such a substrate using a patterned template to direct self-assembly.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, for example of an imprint template or of other substrates, and chemical resists may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

A self-assemblable block copolymer is a compound useful in nanofabrication because it may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometres or even less than 10 nm. The size and shape of the domains may be controlled by manipulating the molecular weight and composition of the different block types of the copolymer. The interfaces between the domains may have line width roughness of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer such as (A-B-C) block copolymer may be useful, as may an alternating or periodic block copolymer e.g. $[-A-B-A-B-A-B]_n$ or $[-A-B-C-A-B-C]_m$ where n and m are integers. The blocks may be connected to each other by covalent links in a linear or branched fashion (e.g., a star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the numbers of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are interesting for lithography applications, as they may provide a resist to form line and space patterns and hole arrays, respectively, when oriented with their domains lying side-by-side on a substrate, and may provide good contrast when one of the domain types is subsequently etched.

Two methods used to guide or direct self-assembly of a polymer, such as a block copolymer, onto a surface are graphoepitaxy and chemical pre-patterning, also called chemical epitaxy. In the graphoepitaxy method, self-organization of a block copolymer is guided by topological pre-patterning on the substrate. A lamellar self-assembled block copolymer can form a parallel linear pattern with adjacent lines of the different polymer block domains in the enclosure or trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the graphoepitaxy template by the side walls being spaced to fit several domains of the block copolymer side-by-side. For hexagonal or tetragonal (cylindrical) ordered patterns, the graphoepitaxy features may be pillars standing in place of cylindrical domains of the ordered pattern of the block copolymer.

In the chemical pre-patterning method (referred to herein as chemical epitaxy), the self-assembly of block copolymer domains is guided by a chemical pattern (i.e. a chemical epitaxy template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical epitaxy pattern may comprise a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of pre-patterned features on the substrate (so-called density or pitch multiplication). As was the case with graphoexitaxy, chemical pre-patterning is not limited to a linear pre-pattern; for instance the chemical epitaxy template may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

SUMMARY

Typically, the height of features of a graphoepitaxy template is of the order of the thickness of the block copolymer layer to be ordered, so, for instance, from 20 nm to 150 nm whereas for a chemical epitaxy template, the height difference between adjacent regions of a chemical epitaxy template will typically be less than about 15 nm, say less than about 10 nm or even less than about 5 nm in order to minimize or reduce likelihood of defect formation.

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between domains of different blocks lying substantially perpendicular to the plane of the surface.

A neutral surface for use in chemical epitaxy and graphoepitaxy is particularly useful. It may be used on surfaces between specific orientation regions of an epitaxy template. For instance in a chemical epitaxy template to align a di-block copolymer with A and B blocks, where A is hydrophilic and B is hydrophobic in nature, the chemical pattern may comprise hydrophobic pinning sites with a neutral orientation region between the hydrophobic sites. The B domain may preferentially assemble onto the hydrophobic pinning sites, with several alternating domains of A and B blocks aligned over the neutral region between the specific (pinning) orientation regions of the chemical epitaxy template.

For instance In a graphoepitaxy template to align such a di-block copolymer, the graphoepitaxy pattern may comprise hydrophobic resist features, such as pillars or side-walls, with a neutral orientation region between the hydrophobic resist features. The B domain may preferentially assemble alongside the hydrophobic resist features, with several alternating domains of A and B blocks aligned over the neutral orientation region between the pinning resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to 40 nm, or less than or equal to 20 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable block copolymer may be deposited onto a substrate with a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern of the ordered block copolymer may be transferred by so-called transfer etching using an etching means which is resisted by the second domain type and so forms recesses in the substrate surface where the surface has been laid bare.

Chemical epitaxy can provide good alignment and moderate pitch multiplication when directing ordering of self-assemblable block copolymer, but defects which arise during self-assembly may transfer to neighboring regions. Image placement is generally more accurate for chemical epitaxy than for graphoepitaxy. However, methods for the formation of a patterned chemical epitaxy template on a surface of a substrate may require a method that includes complex and undesired process steps such as multiple patterning, thermal reflow and lift-off processes. If a graphoepitaxy template is desired in combination with a chemical epitaxy template, a separate epitaxial pattern formation process may be required for each of the chemical epitaxy and graphoepitaxy templates, for instance because of the considerable height differences desired for features of chemical epitaxy and graphoepitaxy patterns. If the chemical epitaxy and graphoepitaxy patterns are to work in unison for direction of self-assembly, extremely accurate mutual alignment of the two pattern types will likely be necessary, and this may be difficult to achieve when the patterns are provided in separate process stages.

Recently, Cheng et al. (Y. Cheng et al, ACS Nano, 2010, 4(8), 4815) showed that it is possible to start with a substrate provided with an appropriate anti-reflection coating (ARC) and spin-coat a polarity switched 193 nm photoresist onto the ARC. After lithographic exposure, the chemically enhanced photoresist is developed in a positive tone and the remaining features trimmed to 30 nm line width. Subsequently, a 193 nm flood exposure and post exposure bake is applied to harden the resist pattern. A crosslinkable neutral orientation layer is then spin-coated and cured, covering both the open substrate areas as well as the resist features. Finally, the resist features and the crosslinked orientation layer attached to the resist features, are removed by lift-off resulting in a sparse chemical epitaxy pattern consisting of alternating regions of neutral orientation layer with regions of bare ARC. Subsequently, a suitable block copolymer is deposited via spin-coating and annealed.

Park et al. (S. H. Park et al, Soft Matter 2010, 6, 120) have reported a different method to obtain a chemical pre-pattern. The method starts with a substrate with ARC coating, neutral orientation layer and positive tone photoresist. After lithographic exposure and development, thermal reflow is used to shrink the openings in the resist to dimensions that are desirable for chemical epitaxy. Subsequently, the neutral orientation layer is etched away in the narrowed resist openings and finally the resist is stripped to generate the chemical pre-pattern. A suitable block copolymer is deposited via spin-coating and annealed.

For a patterned chemical epitaxy template, it is desirable that differences in thickness between adjacent portions of the patterned template are about 15 nm or less, such as about 10 nm or less, or even about 5 nm or less, in order to avoid defects in the ordered block copolymer self-assembled over the template. It would be desirable to have a process and method for forming a patterned chemical epitaxy template where the pattern may be formed using direct photolithographic patterning of a layer, for instance using actinic radiation, such as UV radiation. In particular, it would be desirable to provide a patterned chemical epitaxy template by direct photolithographic patterning of a neutral orientation layer so that pinning sites are formed in or on the layer. It is also desirable that the chemical epitaxy template is not exposed to development, strip or etch media that may alter or modify a surface property of the patterned chemical epitaxy template.

It is also desirable for a graphoepitaxy template, aligned and working together with a chemical epitaxy template for direction of self-assembly, to be provided in the same process as the process providing the chemical epitaxy template in order to provide good alignment and to reduce process complexity. Also, because of the need to be able to align and position a substrate for one or more device lithography steps subsequent to application of a chemical epitaxy template on the substrate, it is desirable to provide one or more substrate alignment features, by the same process, accurately positioned relative to the chemical epitaxy template, for use in subsequent alignment of the substrate carrying the chemical epitaxy template or the ordered block copolymer whose self-assembly was directed by the template.

Accordingly, it is desirable to provide, e.g., a simple method for providing a patterned template, including a chemical epitaxy template, on a substrate surface, for use in directing self-assembly of a layer of block copolymer for subsequent use, e.g., as a resist layer suitable for use in device lithography. In particular, it is desirable to provide, e.g., a method using photolithography, for instance with actinic radiation, such as UV radiation, to form such a template. It is desirable to provide, e.g., a patterned template for directing self-assembly of a polymer which addresses or overcomes one or more of the problems in the art for patterned templates. For instance, it is desirable to provide a method which removes or reduces the need for chemical treatment of the patterned chemical epitaxy template after exposure to radiation. Furthermore, it is desirable to provide, for example, a method to produce a chemical epitaxy template combined with and accurately aligned with a graphoepitaxy template arranged to direct self-assembly in a unified fashion. It is desirable to provide, e.g., a template for directing self-assembly of a polymer which is capable of directing self-assembly of a block copolymer to produce a self-assembled block copolymer layer with low defectivity.

According to an aspect of the invention, there is provided a method of forming a patterned template, comprising a chemical epitaxy template, on a substrate, for orientation of a self-assemblable block copolymer comprising first and second polymer blocks, the method comprising:

providing a resist layer of a positive tone resist on the substrate, the resist layer having an interface with the substrate and an outer face opposed to the interface;

selectively exposing a first portion of the resist layer with actinic radiation, such as UV radiation, by a photolithographic method, leaving an unexposed portion at the outer face having a width greater than or equal to a critical dimension size of the photolithographic method, wherein the selective exposure is carried out with an intensity of actinic radiation sufficient to expose a continuous region of the resist layer between exposed portions, leaving an interfacial unexposed resist portion at the interface, having a width less than the critical dimension size of the photolithographic method; and removing the exposed resist layer, the unexposed resist portion left as first remaining resist portions at the interface, separated by a portion of bared substrate, wherein the first remaining resist portion provides a basis for the chemical epitaxy template of the patterned template.

The outer face of the resist layer is the face of the resist later that is typically in contact with air, opposite to the other face of the resist, which other facer forms the interface between the resist layer and the substrate.

According to an aspect of the invention, there is provided a method of forming an ordered block copolymer layer on a surface of a substrate, the method comprising:

providing a surface of a substrate, having a patterned template thereon, the patterned template provided by a method described herein;

depositing a self-assemblable polymer layer directly onto the patterned template; and treating the self-assemblable block copolymer layer to provide self-assembly into an ordered block copolymer layer, with the ordering directed by the patterned template.

According to an aspect of the invention, there is provided a lithography method for patterning a surface of a substrate by resist etching, wherein the method comprises providing an ordered block copolymer layer at the surface by a method described herein, wherein the ordered block copolymer layer is subsequently used as a resist layer.

According to an aspect of the invention, there is provided a method of forming a device topography at a surface of a substrate, the method comprising using the ordered block copolymer layer formed by a method described herein as a resist layer while etching the substrate to provide the device topography.

The following features are applicable to all the various embodiments of the invention where appropriate. When suitable, combinations of the following features may be employed as part of methods described herein, for instance as set out in the claims. The methods described herein may be particularly suitable for use in device lithography. For instance the methods may be used for treatment or formation of a resist layer of self-assembled polymer for use in patterning a device substrate directly or for use in patterning an imprint template for use in imprint lithography.

The self-assemblable block copolymer may be a block copolymer as set out hereinbefore comprising at least two different block types, referred to as first and second polymer blocks, which are self-assemblable into an ordered polymer layer having the different block types associated into first and second domain types. The block copolymer may be a di-block copolymer or a tri-block or multi-block copolymer. An alternating or periodic block copolymer may also be used as the self-assemblable polymer. Although only two domain types may be mentioned in some of the following aspects and examples, an embodiment of the invention is also applicable to a self-assemblable polymer with three or more different domain types. The self-assemblable block copolymer is desirably a di-block copolymer.

By "chemical affinity", in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity. Chemical affinity of a surface may be measured, for instance, by means of contact angle measurement using various liquids, so that if one surface has the same contact angle for a liquid as another surface, the two surfaces may be said to have substantially the same chemical affinity for the liquid. If the contact angles differ for the two surfaces, the surface with the smaller contact angle has a higher chemical affinity for the liquid than the surface with the larger contact angle.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

By "bonding" or "linking" as referred to herein, it is meant that a bond such as a covalent bond, ionic bond or hydrogen bond is present, either within a molecule, or between a surface and a molecule, i.e. a bond stronger than mere van der Waals attraction. Desirably, the bonding or linking referred to herein is covalent or ionic bonding, more desirably covalent bonding.

According to an embodiment, there is provided a method involving providing a resist layer of a positive tone resist on the substrate. The resist layer forms an interface with the substrate and also has an outer face opposed to the interface. The resist layer may be provided by any suitable method, such as spin coating of a resist solution in a solvent followed by evaporative drying to provide the resist layer on the substrate. By a positive tone resist is meant a resist which, once exposed to, e.g., ultraviolet radiation, becomes or is rendered soluble in a solvent so that when subjected to rinsing with the solvent, an exposed portion of the resist is washed away while an unexposed portion of the resist remains in place as a result of it being insoluble in the solvent.

The substrate may typically be a semiconductor substrate, and may comprise a plurality of layers forming the substrate. For instance, the outermost layer of the substrate upon which the resist layer is provided, may be an ARC (anti-reflection coating) layer. Other arrangements for the substrate and its outermost layer, in relation to certain embodiments of the invention, are set out hereinafter.

The method involves selectively exposing one or more first portions of the resist layer with actinic radiation, such as UV radiation, by a photolithographic method, leaving one or more unexposed portions at the outer face having a width greater than or equal to a critical dimension size of the photolithographic method. The actinic radiation may suitably be UV radiation such as DUV (deep UV). The selective exposure to actinic radiation may be by patterning of the radiation with a lithography apparatus. A conventional lithographic patterning method such as mask or maskless UV lithography may be used to provide a desired high resolution exposure pattern on the resist layer to give the exposed and unexposed regions. Typical DUV lithography is carried out using UV radiation having a wavelength of about 193 nm.

The selective exposure is carried out with an intensity of actinic radiation sufficient to expose a continuous region of the resist layer below and between exposed portions, leaving an interfacial unexposed resist portion at the interface, having a width less than the critical dimension size of the photolithographic method. Consequently, when the resist layer is subsequently washed with a solvent, the exposed portion of the resist will dissolve in the solvent and will be washed away. The unexposed portion of resist which is not bonded to the interface will also be washed away. The unexposed resist portion at the interface will remain at the interface, bonded to it, as this resist portion has not been rendered soluble in the solvent by exposure to radiation. A portion of the resist layer at its outer face, for instance, between exposed regions at the outer face, may also remain unexposed, but this will be washed away when the continuous region of exposed resist layer is dissolved by the solvent. The result is to leave an interfacial unexposed resist portion at the interface having a width less than a critical dimension size of the photolithographic method. This may also be referred to as one or more sub-resolution features, and may have a width of the order of about 30 nm or smaller.

Essentially, the actinic radiation exposure intensity is selected to be such that the resist layer is overexposed such that a region of the resist layer not directly under the exposed portion at the outer face is also rendered soluble as the radiation spreads laterally through the resist layer under the outer surface due to its excessive intensity. The intensity of actinic radiation is selected in order to leave an interfacial unexposed resist portion at the interface. The interfacial unexposed resist portion may have a width less than a critical dimension size of the photolithographic method, i.e. a sub-resolution feature, making it particularly suitable for use in a chemical epitaxy template. The height of the interfacial unexposed resist portion will typically be substantially similar to the width of the portion, and will be considerably less than the overall width of the resist layer was originally in place on the substrate.

Hence, in the removal of the exposed resist layer, the unexposed resist portion is left as first remaining resist portions at the interface, separated by a portion of bared substrate. These first remaining resist portions provide a basis for the chemical epitaxy template of the patterned template. The first remaining resist portions may actually be used as the pinning or nucleation sites of the chemical epitaxy template, or may be used as a resist in subsequent processing to form the chemical epitaxy template.

For instance, the first remaining resist portions may remain at the interface as pinning sites of the chemical epitaxy template, with the bared substrate acting as a neutral orientation region having a similar chemically affinity for both the first and second blocks of the block copolymer. In other words, the first remaining resist portions may act directly as the pinning sites of the chemical epitaxy template, the first remaining resist portions having a higher chemical affinity for one of the blocks of the self-assemblable block copolymer than for the other block.

In this way, the domains of the self-assemblable block copolymer formed of the blocks having a high chemical affinity with the first remaining resist portions will be driven by chemical affinity to position at these first remaining resist portions as a self-assemblable polymer is caused to self-assemble over the chemical epitaxy template. The bared substrate, having a similar chemical affinity for both the first and second blocks of the block copolymer, allows the self-assembled or ordered block copolymer to form with its domains lying side by side in the regions lying between the first remaining resist portions acting as pinning sites.

In an embodiment, the first remaining resist portions may be exposed to actinic radiation, after removal of the exposed resist layer, in order to provide the first remaining resist portions with a modified chemical affinity. This may be useful to render the first remaining resist portions insoluble to a solvent used for the deposition of the self-assemblable block copolymer, or for instance, to render the first remaining resist portions of a high chemical affinity for one of the blocks of the self-assemblable block copolymer compared to the other block.

In an embodiment, the method may further comprise providing an orientation layer at the interface, prior to providing the resist layer on the substrate, the orientation layer having a higher chemical affinity for one block of the self-assemblable block copolymer than for the other block,
  etching the bared substrate to remove orientation layer not lying under the first remaining resist portions in order to lay bare an underlying layer of the substrate, and
  subsequently removing the first remaining resist portions to leave portions of un-etched orientation layer on the substrate as pinning features of the chemical epitaxy template separated by a portion of the bared underlying layer,
  wherein the bared underlying layer has a similar chemical affinity for both the first and second blocks of the block copolymer.

In an embodiment, the bared substrate at the interface may have a higher chemical affinity for one block, than for the other block, of the self-assemblable block copolymer, and the method may further comprise:
  providing a neutral layer on the portion of bared substrate after the removal of the exposed resist layer, the neutral layer having a similar chemical affinity for each of the blocks of the self-assemblable block copolymer, and
  removing the first remaining resist portions to leave bared substrate portions separated by a portion of neutral layer on the substrate as a chemical epitaxy template with the bared substrate portions as pinning features of the chemical epitaxy template. Suitably, the first remaining resist portions may be exposed to actinic radiation prior to providing the neutral layer. This may be effective to render the first remaining resist portions insoluble to a solvent used for the deposition of the neutral layer.

In an embodiment, the method may further comprise selectively exposing a second portion of the resist layer with actinic radiation by the photolithographic method, leaving a second unexposed portion at the outer face having a width greater than the critical dimension size of the photolithographic method, the second unexposed portion extending unbroken from the outer face to the interface of the resist layer, such that the removal of exposed resist layer leaves the second unexposed portion as a second remaining resist portion. As a result of the second unexposed portion extending unbroken from the interface to the outer face of the resist layer, the second remaining resist portion will typically be of considerably greater height than the first unexposed portion of resist layer, as measured outwards normal to the substrate.

Although reference is made here to first and second remaining resist portions, it is also intended that this may give rise to only a single first or second remaining resist portion. Similarly, although reference is made here to a first and second remaining resist portion, it is intended that this may not be only a single first or second remaining resist portion.

The second remaining resist portion may be arranged for use as an alignment marker for use in positioning of the substrate and/or chemical epitaxy template for a subsequent lithographic process step. The chemical epitaxy template features will typically be hidden beneath a layer of self-assemblable block copolymer when subsequent substrate alignment is to be carried out, and so the more prominent second remaining resist portion may be used as a visible alignment marker. Also, the chemical epitaxy template features are of small size and low relief/height, so would be difficult to use for substrate alignment even if left uncovered by self-assemblable block copolymer.

The second remaining resist portion may be arranged for use as a graphoepitaxy template, in combination with the chemical epitaxy template, as part of the patterned template for orientation of the self-assembled block copolymer. For instance, the second remaining resist portion may have the same chemical affinity for one of the blocks of the self-assemblable block copolymer as the first remaining resist portions. This enables the second remaining resist portion to be positioned so that the second remaining resist portion may act as a boundary or edge for placement of one domain type of the self-assemblable block copolymer, that domain type having a high chemical affinity for the second remaining resist portion, with the self-assemblable block copolymer forming an ordered layer alignment with the same domain type also positioned over the first remaining resist portions during self-assembly.

The second remaining resist portion may additionally or alternatively be exposed to actinic radiation, after removal of the exposed resist layer in order to modify the chemical affinity of the second remaining resist portion. The second remaining resist portion may be selectively exposed after removal of the exposed resist layer in order to modify its chemical affinity. This may be carried out at the same time as exposure of the first remaining resist portions, or may be carried out independently of any exposure of the first remaining resist portions, so that the first and second remaining resist portions may by provided with the same or with different chemical affinities—e.g. both hydrophobic, both hydrophilic or one type hydrophobic with the other type hydrophilic.

Typically, the second remaining resist portion may be a plurality of second remaining resist portions spaced on the substrate to act as a graphoepitaxy template with one or more first remaining resist portions in the region between each pair of second remaining resist portions located to act as a chemical epitaxy template in unison with the graphoepitaxy template.

In an embodiment, there is provided a method of forming an ordered block copolymer layer on a surface of a substrate, the method comprising:
  providing a surface of a substrate, having a patterned template thereon, the patterned template provided by a method described herein;
  depositing a self-assemblable polymer layer directly onto the patterned template; and
  treating the self-assemblable block copolymer layer to provide self-assembly into an ordered block copolymer layer, with the ordering directed by the patterned template.

In an embodiment, there is provided a lithography method for patterning a surface of a substrate by resist etching, wherein the method comprises providing an ordered block copolymer layer at the surface, by a method described herein of forming an ordered block copolymer layer on a surface of a substrate, wherein the ordered block copolymer layer is subsequently used as a resist layer.

In an embodiment, there is provided a method of forming a device topography at a surface of a substrate, the method comprising using the ordered block copolymer layer, formed by a method described herein of forming an ordered block copolymer layer on a surface of a substrate, as a resist layer while etching the substrate to provide the device topography.

The patterned chemical epitaxy template may typically comprise narrow pinning features spaced apart by a neutral region. The patterned chemical epitaxy template may have the same periodicity (i.e. unit cell pitch) as the self-assembled block copolymer that it is intended to direct during self-assembly, but more usually, the periodic spacing between adjacent pining sites will correspond to a plurality of unit cells for the self-assembled polymer. This allows for the effect known as density multiplication (sometimes also referred to as pitch multiplication). So, for instance, using an example of a lamellar self-assembled block copolymer phase, having domains of width W1 for the first block and width W2 for the second block, the unit cell period or pitch of the self-assembled polymer will be W1+W2. For the patterned chemical epitaxy template, if this has the same pitch, then it would be alternating stripes of pinning features having width W1 and neutral regions having width W2, each region arranged for chemical affinity with (or neutrality to) the corresponding polymer block.

Another suitable arrangement may have, for instance, pinning sites of width W1, having high chemical affinity for one of the blocks, separated by broader stripes of neutral region of width [n.(W2+W1)+W2], where n is an integer of value 1 or more, such as from 1 to 10, for instance 1, 2, 3, 4, 5, 6, 7, 8, 9 or 10 the unexposed region having similar chemical affinity (i.e. neutral chemical affinity) for first and second blocks. Typically, n will be 1, 2 or 3. The width of the pinning features may be, say from 0.4 W1 to 1.5 W1 (i.e. near to but not necessarily exactly W1) provided that the periodicity of the first regions corresponds to n.[W1+W2], where n is an integer as already set out. In other words, it is not essential that the narrowest pinning features of the chemical epitaxy pattern have exactly the same dimension as the corresponding domain of the self-assembled polymer.

BRIEF DESCRIPTION OF THE DRAWINGS

Specific embodiments of the invention will be described with reference to the accompanying Figures, in which.

DETAILED DESCRIPTION

The described and illustrated embodiments are to be considered as illustrative and not restrictive in character, it being understood that only embodiments have been shown and/or described and that all changes and modifications that come within the scope of the inventions as defined in the claims are desired to be protected.

Figure 1A:
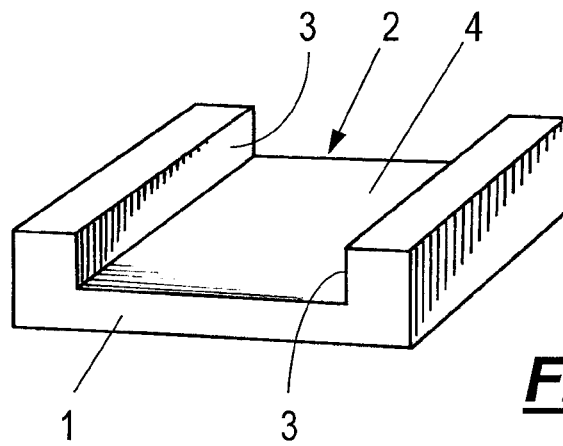
FIGS. 1A to 1C schematically depict directed self-assembly of A-B block copolymers onto a substrate by graphoepitaxy and formation of relief patterns by selective etching of one domain.
Figure 1B:
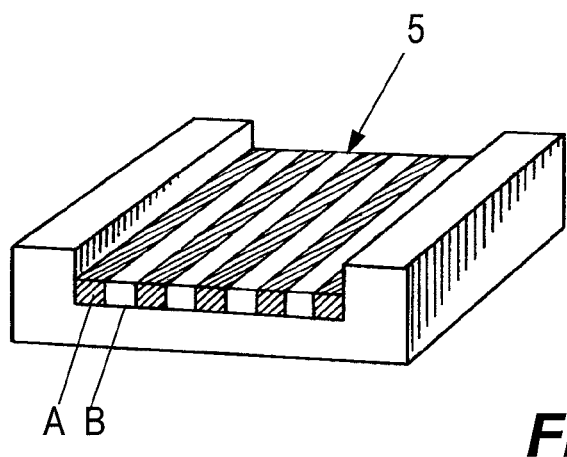
Figure 1C:
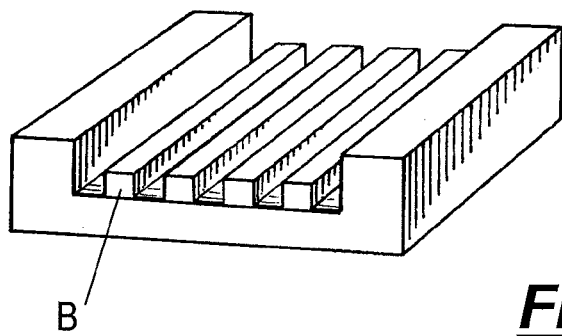

FIG. 1A shows a substrate 1 with a trench 2 formed therein bounded by side walls 3 and a bottom surface 4. In FIG. 1B, a self-assemblable A-B block copolymer with, e.g., hydrophilic A blocks and, e.g., hydrophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the a side wall 3, which is also, e.g., hydrophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
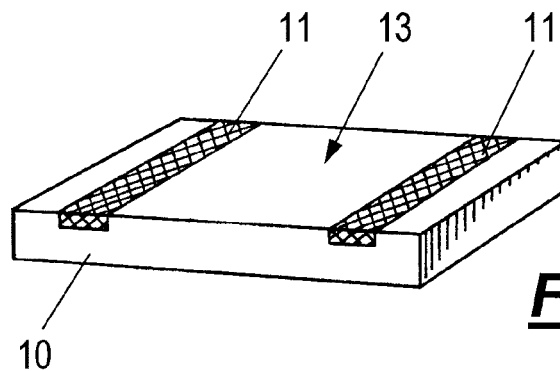
FIGS. 2A to 2C schematically depict directed self-assembly of A-B block copolymers onto a substrate by chemical epitaxy and formation of relief patterns by selective etching of one domain.
Figure 2B:
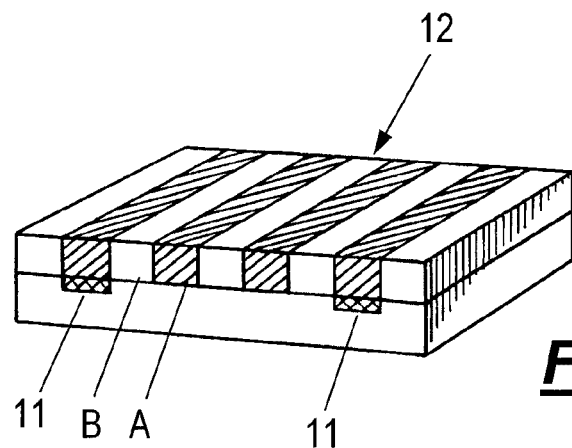
Figure 2C:
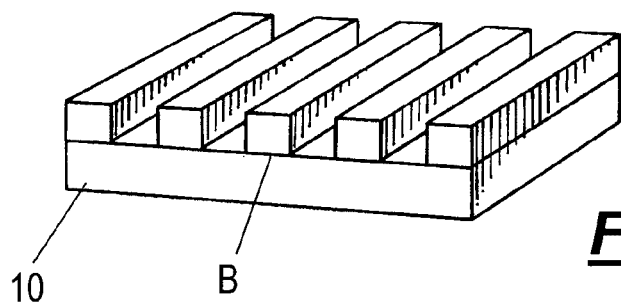

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with, e.g., hydrophilic A blocks and, e.g., hydrophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning or chemical epitaxy. The type A domains have nucleated atop the pinning or nucleation stripes 11, which are also, e.g., hydrophilic. In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning or nucleation stripes 11 with a type A domain atop each pinning stripe 11.

In the following examples, the di-block copolymer used as self-assemblable polymer is a poly(styrene-b-methylmethacrylate) block copolymer denoted by the acronym PS/PMMA arranged for self-assembly as a lamellar pattern having parallel domains oriented side by side on the substrate. However, the method is also applicable to other self-assemblable block copolymers and other ordered patterns, such as hexagonal or tetragonal patterns. The hydrophilic domains of PMMA are shown as the white region 35 of the ordered block copolymer, whereas the hydrophobic domains of PS are shown as the hatched region 36 of ordered block copolymer in the Figures. The unexposed, hydrophobic resist region is shown in white, whereas the resist region that has been exposed to radiation to render them hydrophilic, is shown in black.

FIGS. 3A to 3D show schematically the sequential stages of a process according to an embodiment of the invention. A substrate 30 has had a resist layer 31 deposited on its surface and in FIG. 3A the resist layer 31 is shown after it has been exposed to actinic radiation leaving one or more unexposed portions 32 at the interface between the resist layer 31 and the substrate 30. The exposed resist is present as a continuous region of the resist layer 31. (There may also be an unexposed resist region at the outer face of the resist layer 31, but it has not been shown.)

Figure 3A:
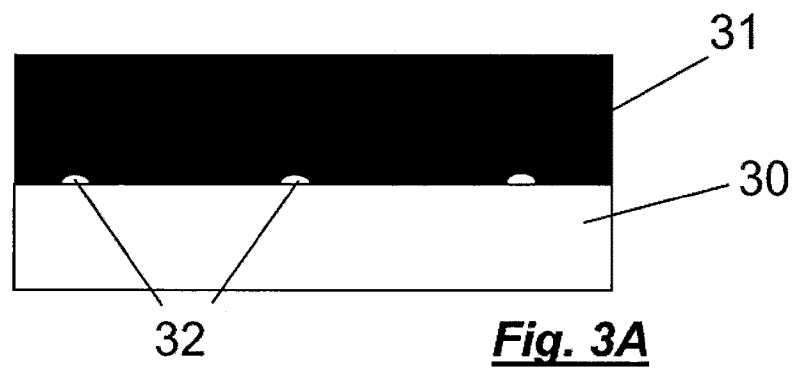
FIGS. 3A to 3D schematically depict sequential stages of a process according to an embodiment of the invention in which the first remaining resist features 33 act as pinning sites for a chemical epitaxy template.
Figure 3B:
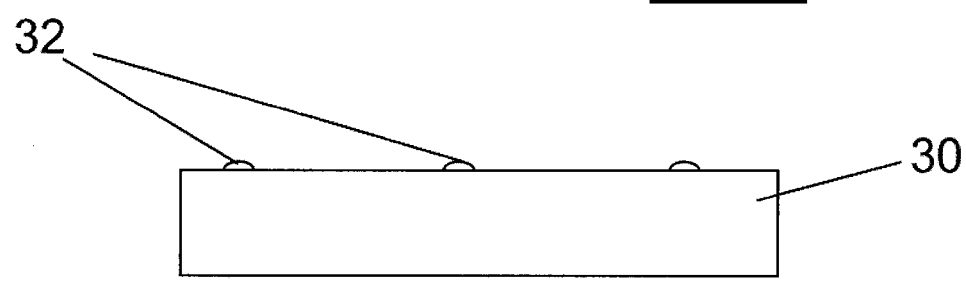
Figure 3C:
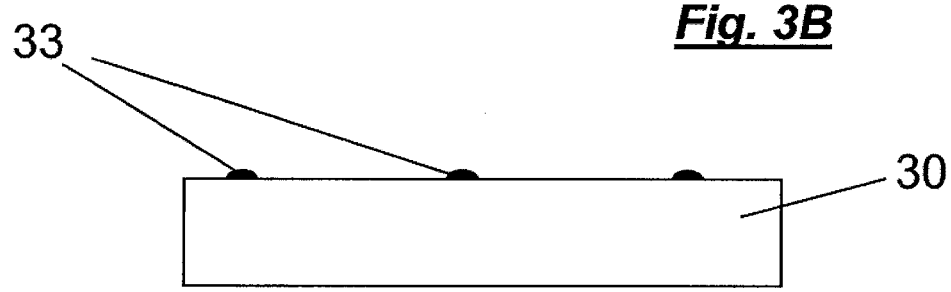

In FIG. 3B, the exposed portion of the resist layer has been removed using a solvent in which the exposed resist is soluble, leaving an interfacial unexposed resist portion 32 at the interface, with the unexposed resist portions having a width of less than the critical dimension size of the photolithographic method used for carrying out the exposure of the resist layer. An unexposed resist region near the outer face of the resist layer 31 will be washed away as the continuous exposed region is dissolved. For a typical positive tone resist, such as the resist used for this embodiment, the exposed resist is hydrophilic in nature whereas the unexposed resist is hydrophobic in nature. In FIG. 3C, the substrate 30 and first remaining resist portion 33 are shown after flood exposure to ultraviolet radiation in order to expose the first remaining resist portion 33 in order to render the portion 33 hydrophilic in nature.

Figure 3D:
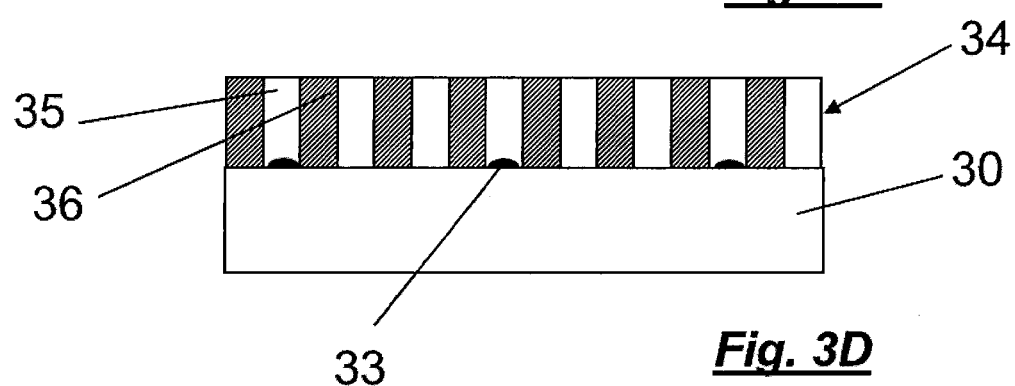

FIG. 3D shows the substrate 30 and first remaining resist portion 33 with an ordered, self assembled block copolymer layer 34 deposited and assembled on the surface of the substrate 30. The first remaining resist portion 33 acts as pinning sites of a resulting chemical epitaxy template, with the hydrophilic domain 35 of the block copolymer locating preferentially over the hydrophilic first remaining resist portion 33 during self-assembly. The bared substrate 30 between the first remaining resist portions 33 is neutral in nature with respect to the domains of the block copolymer and so has a similar chemical affinity for each block or domain of the block copolymer. This permits the ordered block copolymer 34 to be assembled with the alternating domains 35, 36 positioned side-by-side on the neutral surface the substrate 30, with the overall positioning and orientation of the ordered block copolymer pattern 34 controlled by the first remaining resist portion 33 pinning the hydrophilic domain 35 of the ordered pattern in place by acting as pinning sites of the chemical epitaxy template.

FIGS. 4A to 4D shows a further embodiment. The chemical epitaxy template formed in a manner as described above in relation to FIGS. 3A to 3D.

Figure 4A:
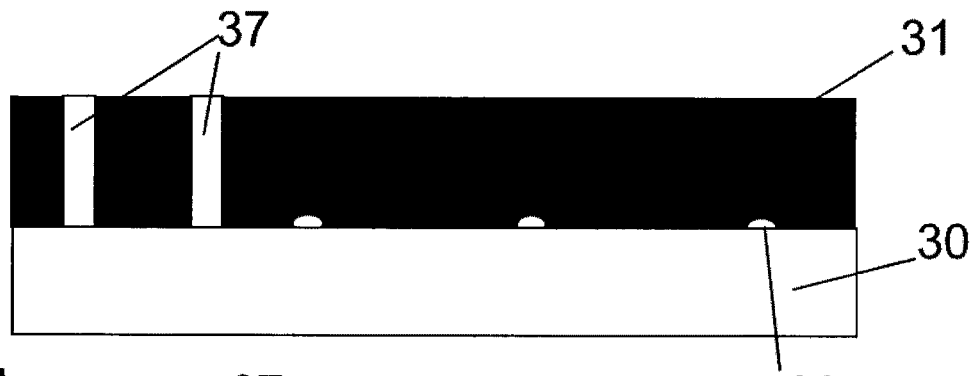
FIGS. 4A to 4D schematically depict sequential stages of a process according to an embodiment of the invention in which the first remaining resist features 33 act as pinning sites for a chemical epitaxy template and second remaining resist features 38 act as a substrate alignment feature.
Figure 4B:
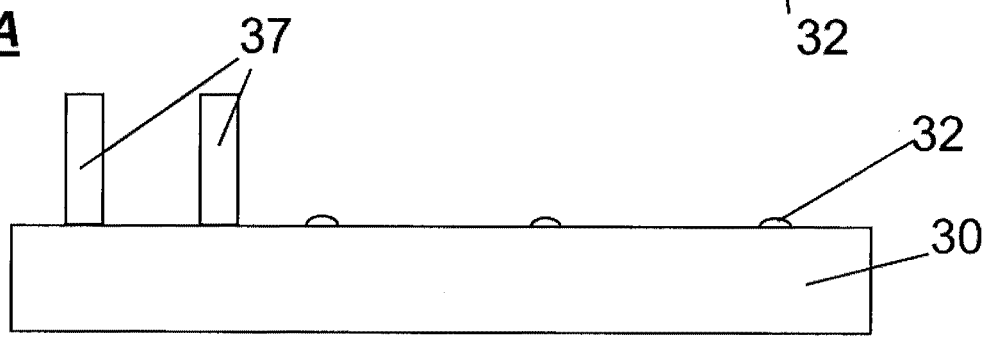
Figure 4C:
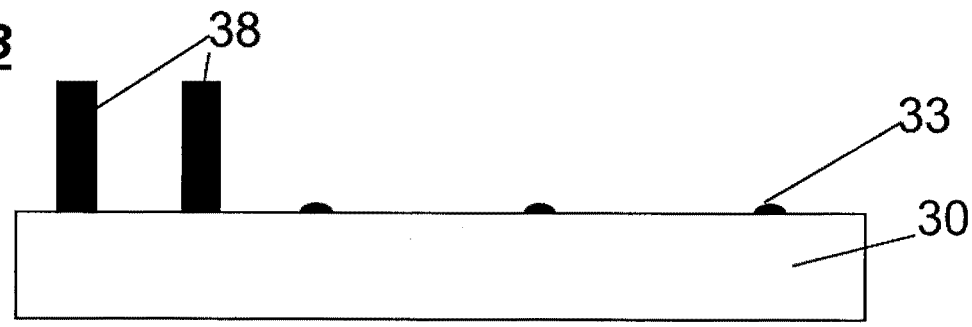
Figure 4D:
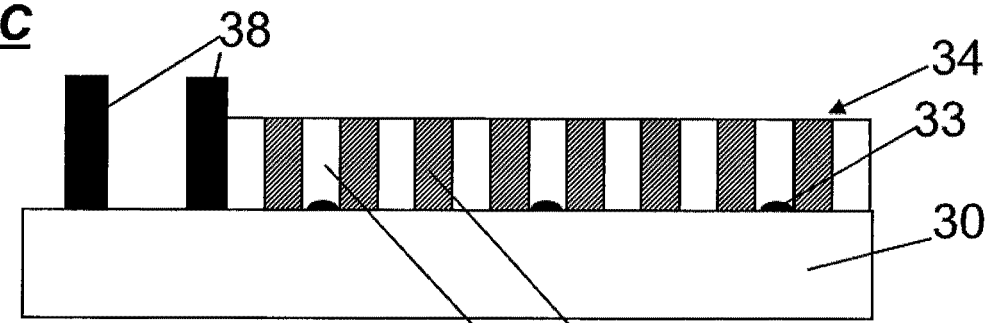

For this embodiment, one or more second portions 37 of the resist layer 31 remain unexposed during the exposure of the resist layer 31, with the second portion 37 extending unbroken between the outer face of the resist layer and its interface with the substrate 30. As a result of this, following removal of the exposed resist portion, as shown in FIG. 4B, the second remaining resist portion 37 is of considerably greater height than the first remaining resist portion 32. Following flood exposure to actinic radiation, as depicted in FIG. 4C, the second remaining resist portion 38 remains in place on the substrate 30 as a substrate alignment marker which can be used for substrate alignment of the substrate 30 in a subsequent lithography step. Furthermore, following exposure to render the second remaining resist portion 38 hydrophilic, a second resist portion 38 of the substrate alignment feature may be used as a graphoepitaxy template side-wall to assist in the direction of self-assembly of the block copolymer layer 34, by being positioned relative to the chemical epitaxy pattern so that a hydrophilic domain 35 is located immediately adjacent to the second resist portion 38 following the assembly directed by the chemical epitaxy pattern (or the nucleation may be driven by the feature 38 and subsequently mesh with the chemical epitaxy pattern as ordering spreads from the graphoepitaxy feature). It will be understood that the distance from the side-wall of the second resist portion to the first pinning site may be, for instance, n. (W1+W2)+Δ, where Δ represents the thickness of a so-called "dead layer", or interfacial zone, of hydrophilic domain at the side-wall, with n, W1 and W2 as already defined hereinbefore.

FIGS. 5A to 5D show a further embodiment. The chemical epitaxy template is formed in the manner as described above in relation to FIGS. 3A to 3D.

Figure 5A:
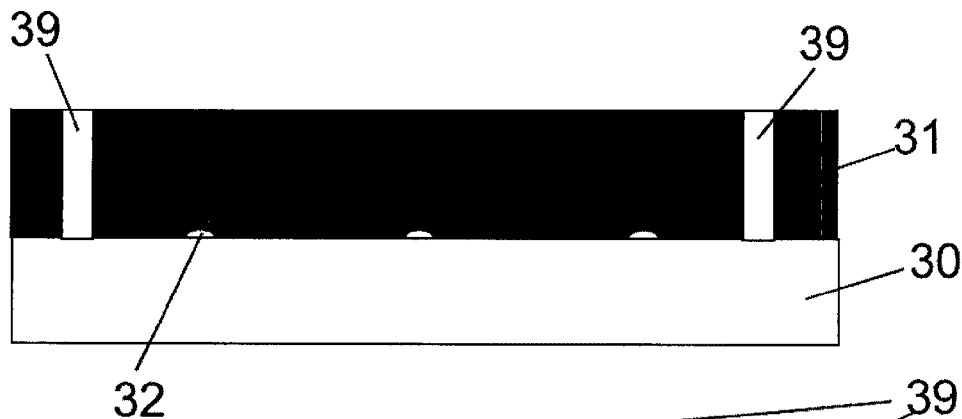
FIGS. 5A to 5D schematically depict sequential stages of a process according to an embodiment of the invention, in which the first remaining resist features 33 act as pinning sites of a chemical epitaxy template and second remaining resist features 40 act as a graphoepitaxy feature.
Figure 5B:
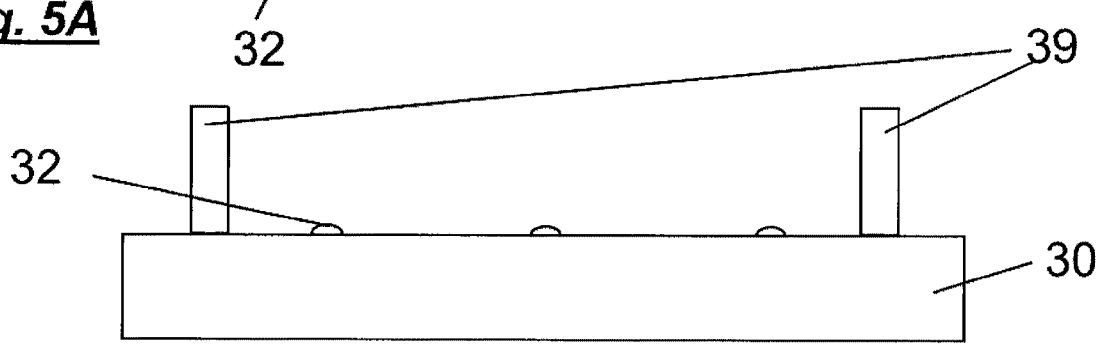
Figure 5C:
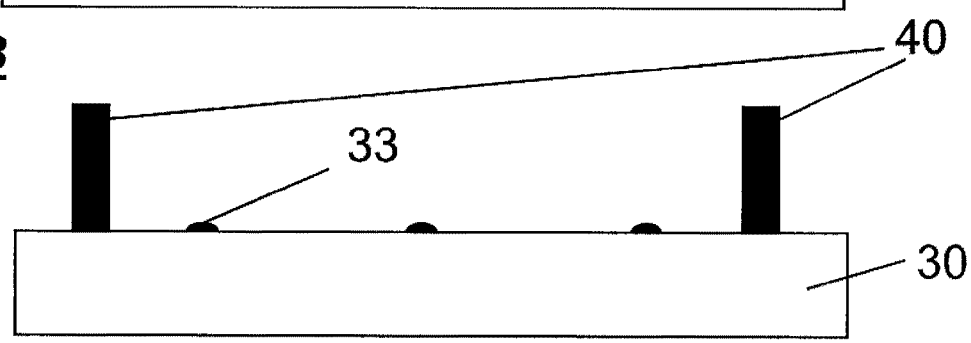
Figure 5D:
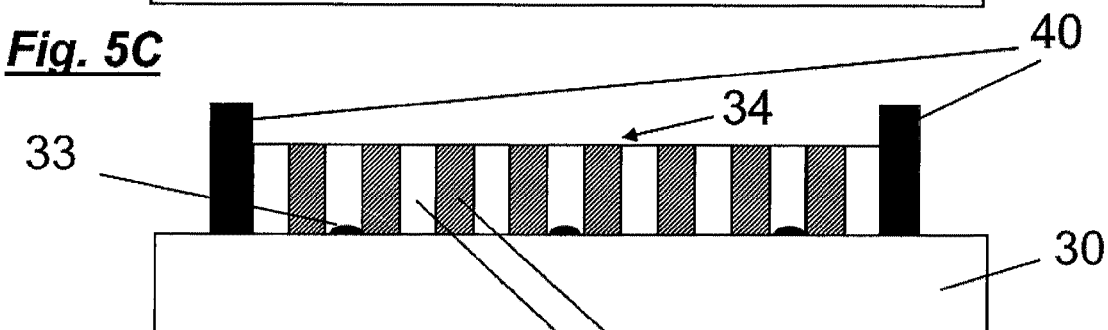

For this embodiment, one or more second portions 39 of the resist layer 31 remain unexposed during the exposure of the resist layer 31, with the second portion 39 extending unbroken from the outer face of the resist layer to its interface with the substrate 30. As a result of this, following removal of the exposed resist portion as shown in FIG. 5B, the second remaining resist portion 39 is of considerably greater height than the first remaining resist portion 32. Following flood exposure to actinic radiation, the state depicted in FIG. 5C, the second remaining resist portion 39 remains in place on the substrate 30 as a graphoepitaxy template which can be used in combination with the chemical epitaxy template formed by the first remaining resist portion 33. Following exposure to render the second remaining resist portion hydrophilic 40, as shown in FIG. 5D, the second remaining resist portion 40 may be used as a side-wall forming a graphoepitaxy template to assist in the direction of self-assembly of the block copolymer layer 34, by being positioned such that the hydrophilic domain 35, located following self-assembly as a result of direction by the chemical epitaxy template, is located immediately adjacent to each hydrophilic second remaining resist portion 40 acting as a graphoepitaxy side-wall. It will be understood that the distance from the side-wall of the second resist portion to the first pinning site may be, for instance, n. (W1+W2)+Δ, where Δ represents the thickness of a so-called "dead layer", or interfacial zone, of hydrophilic domain at the side-wall, with n, W1 and W2 as already defined hereinbefore. It will also be understood that the effectiveness of the patterned template formed by a method herein does not rely upon whether the initial nucleation of the self-assemblable block copolymer occurs as a result of the graphoepitaxy feature or as a result of the chemical epitaxy pattern. In practice, either of these eventualities may take place. A benefit of the method is that it permits a single process to be used to provide both the chemical epitaxy pattern and the graphoepitaxy pattern so that these may be accurately mutually aligned to permit them to direct self-assembly in unison.

FIGS. 6A to 6F show a method according to an embodiment of the invention. The outcome of this embodiment is a substrate having a combined chemical epitaxy and graphoepitaxy pattern on a surface.

Figure 6A:
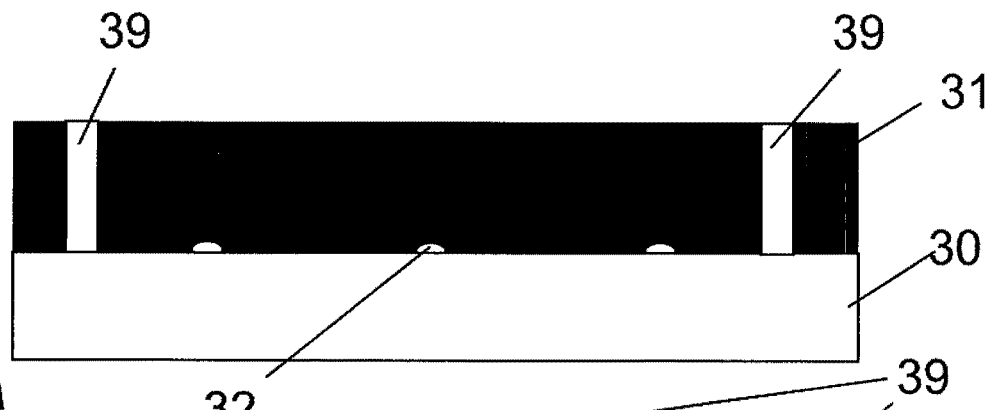
FIGS. 6A to 6F schematically depict sequential stages of a process according to an embodiment of the invention, in which the first remaining resist features 33 are removed in order to provide pinning sites for a chemical epitaxy template and second remaining resist features 40 act as a graphoepitaxy feature.
Figure 6B:
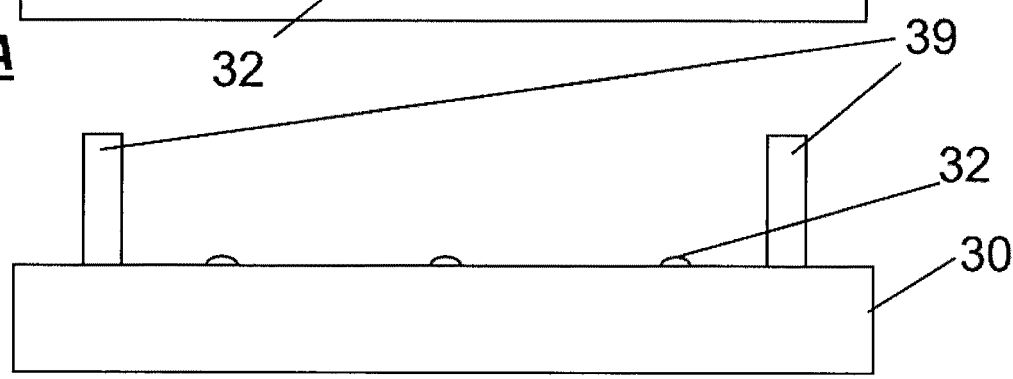
Figure 6C:
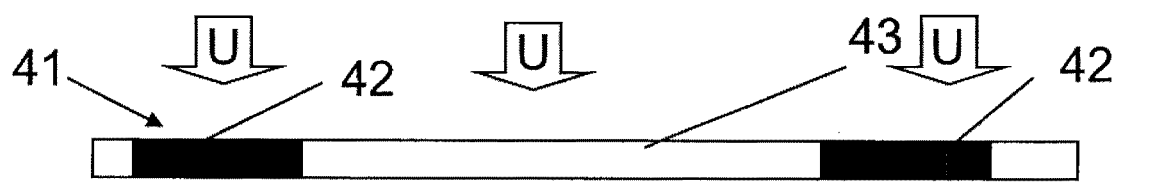
Figure 6C:
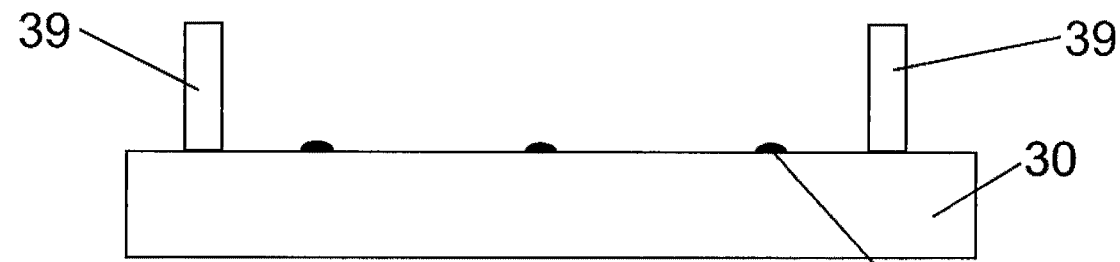

In FIG. 6A, as described above, the resist layer 31 is exposed to radiation by means of a photolithographic method in order to provide first remaining resist portion 32 and second resist portion 39 which are unexposed. As with the earlier embodiments detailed above, the first resist portion 32 comprises sub-resolution features of a low height present at the interface with the substrate 30 whereas the second unexposed resist portion 39 extends through the thickness of the resist layer and is considerably greater height and width than the first resist portion 32. The first remaining resist portion 32 and second remaining resist portion 39 are as shown in FIG. 6B. In FIG. 6C, a lithography mask, 41, with regions 42, opaque to radiation and regions 43, transparent to radiation, is used to selectively expose the first remaining resist portion 32 to radiation giving exposed portion 33, while leaving the second remaining resist portion 39 unexposed. The exposed first remaining resist portion 33 is shown as black in FIG. 6C and in the following FIG. 6D.

Figure 6D:
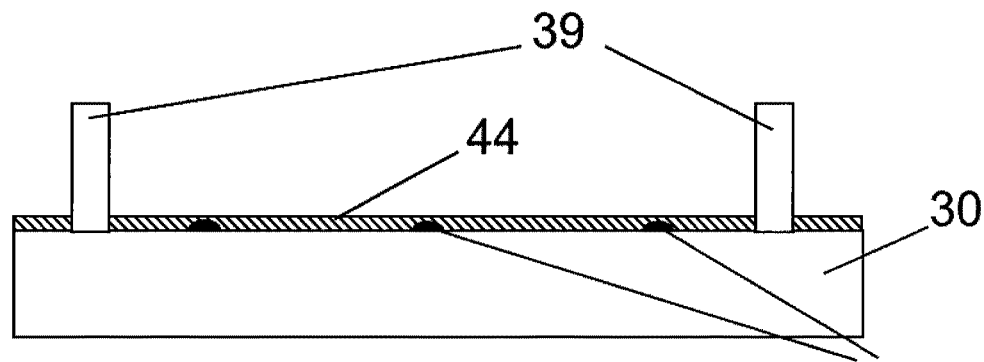
Figure 6E:
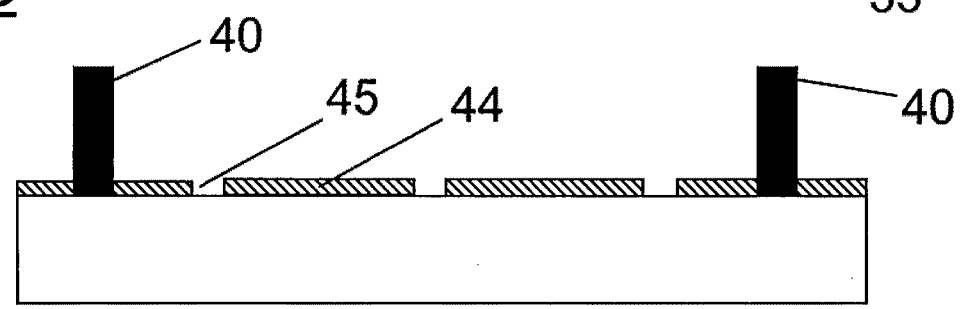

As shown in FIG. 6D, a neutral orientation layer 44 is then deposited over the substrate 30 including the first 33 and second 39 remaining resist portions. The neutral orientation layer 44 will typically be of molecules provided with an end group for bonding the molecules of the neutral orientation layer to the substrate, such as OH groups or silyl groups, for instance, as already described hereinbefore. A silyl group is preferred in order to avoid risk of unwanted dissolution of second remaining resist portion 39. The neutral orientation layer 44 will covalently bond to the exposed substrate, but not to the resist portions 33, 39.

Following deposition of the neutral orientation layer over the substrate and resist portions, the first remaining resist portion 33 is removed by a solvent which dissolves the exposed resist 33, but leaves the unexposed second remaining resist portion 39 on the substrate. In positions where the first remaining resist portion 33 has been removed, a gap 45 is formed in the neutral orientation layer with the substrate 30 laid bare in the gap 45. This leaves the gap 45 able to act as a pinning site of a resulting chemical epitaxy template, because the surface of the substrate for this embodiment has been selected to have a hydrophilic nature (typically for this embodiment, the surface may be an oxide layer, such as silicon dioxide). This arrangement causes the hydrophilic PMMA domain 35 of the self-assemblable block copolymer to preferentially align over the gap 45 during self-assembly. The neutral orientation layer 44 allows either hydrophilic 35 or hydrophobic 36 domains to be deposited upon it, side-by-side, because of the similar chemical affinity of the neutral orientation layer 44 for each of the domain types 35, 36 of the self-assemblable block copolymer. After removal of the first remaining resist portion 33, using, e.g., a hydrophilic solvent, the substrate 30 and second remaining resist portion 39 may be subjected to flood exposure to ultraviolet radiation. This is in order to render hydrophilic the second remaining resist portion 39, shown in black once exposed 40 in FIG. 6E. This hydrophilic second remaining resist portion 40 acts as a side-wall of a graphoepitaxy template for the direction of nucleation of a self assembled block copolymer 34 as indicated in FIG. 6F.

Figure 6F:
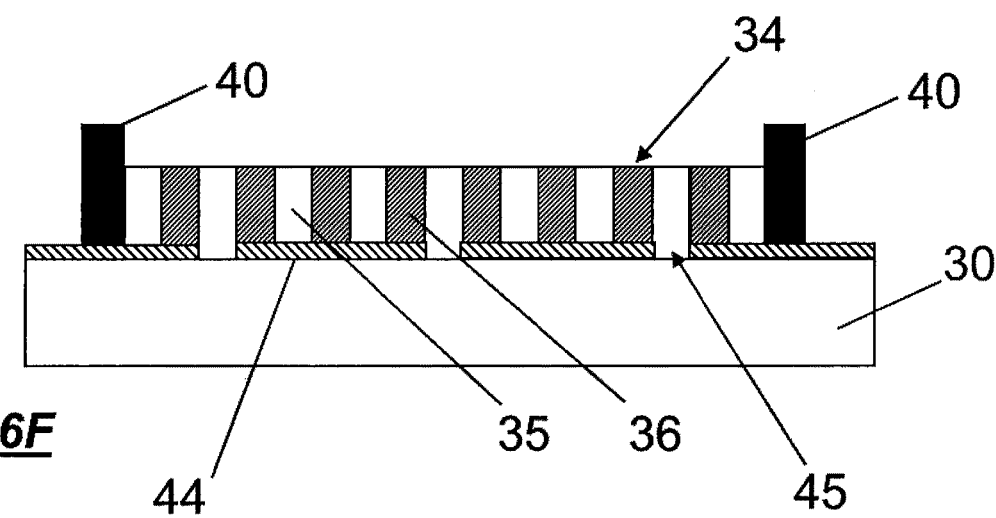

In FIG. 6F, the spacing of the chemical epitaxy template formed by the neutral orientation layer 44 with gap 45, and the graphoepitaxy template of side-wall 40 formed by the hydrophilic second remaining resist portion act together in order to provide directed self-assembly of the self-assemblable block copolymer layer 34 with the hydrophilic PMMA domain 35 positioned at the gaps 45 and the hydrophilic domain 35 at each edge of the layer 34 positioned alongside the exposed hydrophilic second remaining resist portion 40 acting as a side-wall. It will be understood that the distance from the side-wall of the second resist portion to the first pinning site may be, for instance, n. (W1+W2)+Δ, where Δ represents the thickness of a so-called "dead layer", or interfacial zone, of hydrophilic domain at the side-wall, with n, W1 and W2 as already defined hereinbefore.

FIGS. 7A to 7D show a method according to a further embodiment. The outcome of this embodiment is a substrate having a combined chemical epitaxy and graphoepitaxy pattern on a surface.

For this embodiment, an orientation layer 47, having a hydrophobic nature, so that it has a high chemical affinity for the hydrophobic PS block 36 of the self-assemblable block copolymer, is provided on the upper surface of the substrate 30 prior to the deposition of the resist layer 31. Exposure of the resist layer 31 to actinic radiation is carried out as for the previous embodiments to provide first 32 and second 39 unexposed portions of resist. This is the situation reached and shown in FIG. 7A.

Figure 7A:
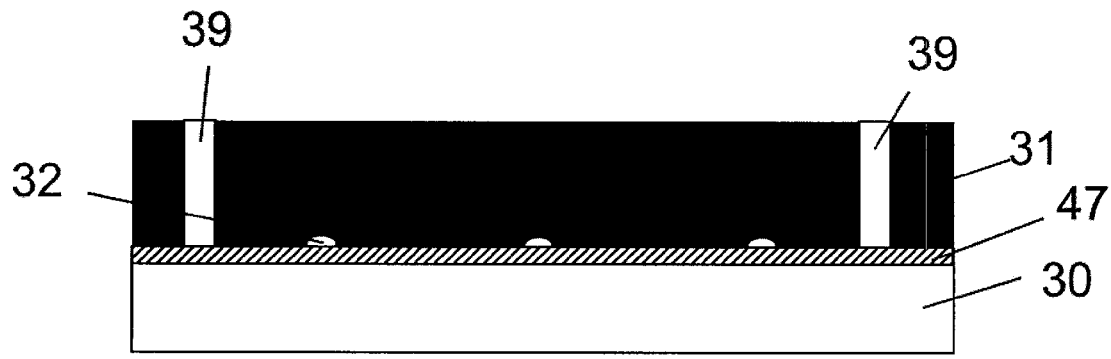
FIGS. 7A to 7D schematically depict sequential stages of a process according to an embodiment of the invention in which the first remaining resist features 32 act as a resist for a subsequent etch of the underlying substrate in order to form a chemical epitaxy template and second remaining resist features 39 act as a graphoepitaxy feature.
Figure 7B:
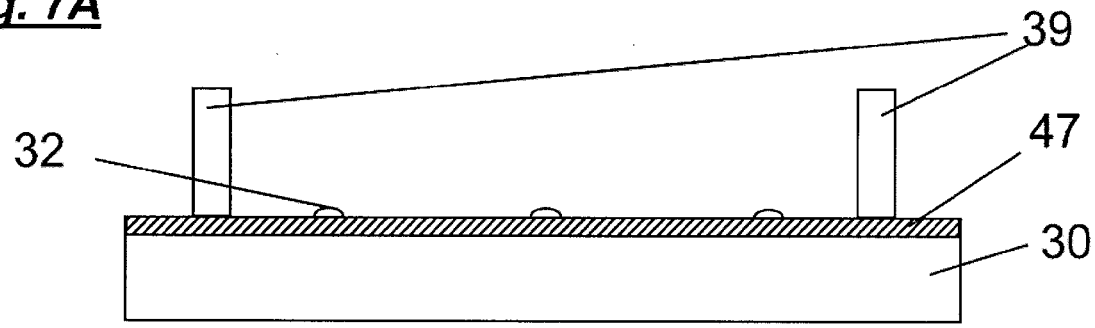

Following the removal of exposed resist, as shown in FIG. 7B, first and remaining resist portions 32, 39 are left on the orientation layer 47 on the substrate 30.

Figure 7C:
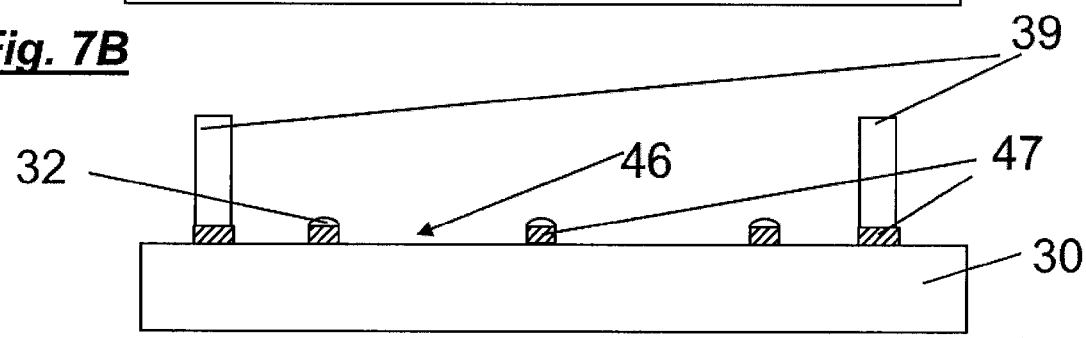
Figure 7D:
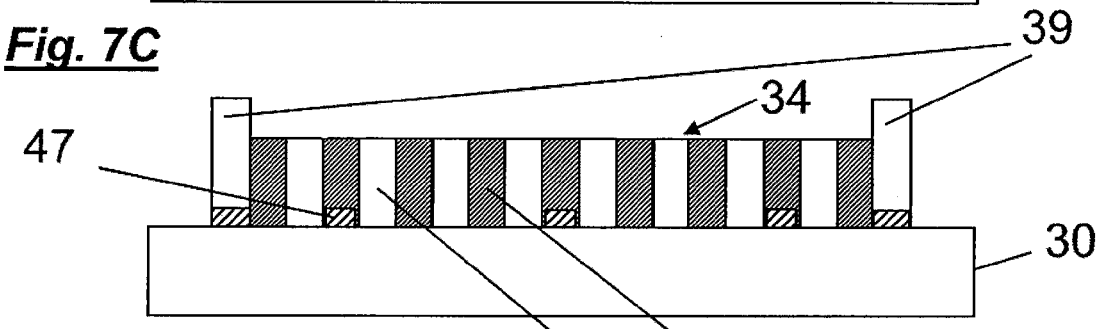

The unexposed remaining resist portions 32, 39 are then used to protect the underlying orientation layer 47, during a chemical etching process which strips away the orientation layer 47 to expose bared substrate 46 save for a portion of the orientation layer 47 protected by the presence of the unexposed first 32 and second 39 remaining resist portions. The outcome of this is shown in FIG. 7C. Subsequently, a brief wash with, e.g., a hydrophilic solvent may be used to remove the first remaining resist portion 32, while still leaving the second remaining resist portion 39 diminished in height but still present and capable of acting as a graphoepitaxy template side wall. FIG. 7D shows the resulting patterned template in use for directed assembly of a self-assemblable block copolymer. The self-assemblable block copolymer layer 34 self assembles with the hydrophobic PS domain 36 preferentially positioned at the remaining portion of hydrophobic orientation layer 47, and with the bared substrate 46 between these portions acting as a neutral orientation layer where the hydrophobic 36 and hydrophilic 35 domains may deposit side-by-side on the surface without a substantial free energy penalty. For this embodiment of the invention, the substrate 30 is chosen to be a material which is neutral to provide a similar chemical affinity towards each of the domains 35, 36 of the self-assemblable block copolymer.

An embodiment of the invention allows for formation, onto a substrate, of a patterned chemical epitaxy template by a simple, direct UV photolithography method without need for complex and/or undesirable process steps such as thermal reflow or complex lift-off etch processes for removal of residual resist. The method allows for a patterned template which combines accurately aligned chemical epitaxy and graphoepitaxy templates, to be prepared using a relatively simple process, with the option of including an accurately placed substrate alignment feature in the patterned template to assist with a subsequent substrate positioning for a further lithography step.

An embodiment of the present invention relates to lithography methods. The methods may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of integrated circuits, bit-patterned media and/or discrete track media for magnetic storage devices (e.g. for hard drives).

In particular, an embodiment of the invention is of use for high resolution lithography, where features patterned onto a substrate have a feature width or critical dimension of about 1 μm or less, typically about 100 nm or less or even about 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers which may be at, or form, the surface of the substrate, or may include other layers such as those specifically mentioned above with reference to particular embodiments of the invention.

The invention claimed is:

1. A method of forming a patterned template, comprising a chemical epitaxy template, on a substrate, for orientation of a self-assemblable block copolymer comprising first and second polymer blocks, the method comprising:
    selectively exposing a first portion of a positive tone resist layer on the substrate with actinic radiation by a photolithographic method, leaving an unexposed portion at an outer face of the resist layer having a width greater than or equal to a critical dimension size of the photolithographic method, wherein the selective exposure is carried out with an intensity of actinic radiation sufficient to expose a continuous region of the resist layer between exposed portions, leaving an interfacial unexposed resist portion at an interface, opposed to the outer face, of the resist layer with the substrate, having a width less than the critical dimension size of the photolithographic method; and
    removing the exposed resist layer, the unexposed resist portion left as first remaining resist portions at the interface, separated by a portion of bared substrate,
    wherein the first remaining resist portions provide a basis for the chemical epitaxy template of the patterned template.

2. The method of claim 1, wherein the first remaining resist portions remain at the interface as pinning features of the chemical epitaxy template, and wherein the bared substrate has a similar chemically affinity for both the first and second blocks of the block copolymer.

3. The method of claim 1, wherein the first remaining resist portions are exposed to actinic radiation after removal of the exposed resist layer to provide the first remaining resist portions with a modified chemical affinity.

4. The method of claim 1, wherein the substrate comprises an orientation layer at the interface, the orientation layer having a higher chemical affinity for one block of the self-assemblable block copolymer than for the other block and wherein the method further comprises:
    etching the bared substrate to remove orientation layer not lying under the first remaining resist portions in order to lay bare an underlying layer of the substrate, and
    subsequently removing the first remaining resist portions to leave portions of un-etched orientation layer on the substrate as pinning features of the chemical epitaxy template separated by a portion of the bared underlying layer,
    wherein the bared underlying layer has a similar chemical affinity for both the first and second blocks of the block copolymer.

5. The method of claim 1, wherein the bared substrate at the interface has a higher chemical affinity for one block, than for the other block, of the self-assemblable block copolymer, and the method further comprises:
    providing a neutral layer on the portions of bared substrate after removal of the exposed resist layer, the neutral layer having a similar chemical affinity for each of the blocks of the self-assemblable block copolymer, and
    removing the first remaining resist portions to leave bared substrate portions separated by a portion of neutral layer on the substrate as a chemical epitaxy template with the bared substrate portions as pinning features of the chemical epitaxy template.

6. The method of claim 1, further comprising:
    selectively exposing a second portion of the resist layer with actinic radiation by the photolithographic method, leaving a second unexposed portion at the outer face having a width greater than the critical dimension size of the photolithographic method, the second unexposed portion extending unbroken from the outer face to the interface of the resist layer, such that the removal of the exposed resist layer leaves the second unexposed portion as a second remaining resist portion.

7. The method of claim 6, wherein the second remaining resist portion is arranged for use as an alignment marker for use in positioning of the substrate and/or chemical epitaxy template for a subsequent lithographic process step.

8. The method of claim 6, wherein the second remaining resist portion is arranged for use as a graphoepitaxy template, in combination with the chemical epitaxy template, as part of the patterned template for orientation of the self-assemblable block copolymer.

9. The method of claim 6, wherein the second remaining resist portion is exposed to actinic radiation, after removal of the exposed resist layer, to modify the chemical affinity of the second remaining resist portion.

10. A method of forming an ordered block copolymer layer on a surface of a substrate, the method comprising:
    providing a surface of a substrate, having a patterned template thereon, the patterned template provided by the method of claim 1;
    depositing a self-assemblable polymer layer directly onto the patterned template; and
    treating the self-assemblable block copolymer layer to provide self-assembly into an ordered block copolymer layer, with the ordering directed by the patterned template.

11. A lithography method for patterning a surface of a substrate by resist etching, wherein the method comprises providing an ordered block copolymer layer at the surface by the method of claim 10, wherein the ordered block copolymer layer is subsequently used as a resist layer.

12. A method of forming a device topography at a surface of a substrate, the method comprising using the ordered block copolymer layer formed by the method of claim 10 as a resist layer while etching the substrate to provide the device topography.

13. A method of forming a patterned template, comprising a chemical epitaxy template, on a substrate, for orientation of a self-assemblable block copolymer comprising first and second polymer blocks, the method comprising:

providing actinic radiation by a photolithographic method to a resist layer on the substrate to expose a continuous region of the resist layer, wherein the exposure is carried out with an intensity of actinic radiation sufficient to leave an interfacial unexposed resist portion at the interface between the resist and the substrate, the unexposed resist portion having a width less than the critical dimension size of the photolithographic method and the continuous exposed region overlying the unexposed resist portion; and removing the continuous exposed region, the unexposed resist portion left as remaining resist portions at the interface, separated by a portion of bared substrate, wherein the remaining resist portions provide a basis for the chemical epitaxy template of the patterned template.

14. The method of claim 13, wherein the remaining resist portions remain at the interface as pinning features of the chemical epitaxy template, and wherein the bared substrate has a similar chemically affinity for both the first and second blocks of the block copolymer.

15. The method of claim 13, wherein the remaining resist portions are exposed to actinic radiation after removal of the continuous exposed region to provide the remaining resist portions with a modified chemical affinity.

16. The method of claim 13, wherein the substrate comprises an orientation layer at the interface, the orientation layer having a higher chemical affinity for one block of the self-assemblable block copolymer than for the other block further and the method further comprising:

etching the bared substrate to remove orientation layer not lying under the remaining resist portions in order to lay bare an underlying layer of the substrate, and subsequently removing the remaining resist portions to leave portions of un-etched orientation layer on the substrate as pinning features of the chemical epitaxy template separated by a portion of the bared underlying layer, wherein the bared underlying layer has a similar chemical affinity for both the first and second blocks of the block copolymer.

17. The method of claim 13, wherein the bared substrate at the interface has a higher chemical affinity for one block, than for the other block, of the self-assemblable block copolymer, and the method further comprises:

providing a neutral layer on the portions of bared substrate after removal of the continuous exposed region, the neutral layer having a similar chemical affinity for each of the blocks of the self-assemblable block copolymer, and removing the remaining resist portions to leave bared substrate portions separated by a portion of neutral layer on the substrate as a chemical epitaxy template with the bared substrate portions as pinning features of the chemical epitaxy template.

18. The method of claim 13, comprising:

illuminating the resist layer with actinic radiation so as to provide an unexposed portion at the outer face, the unexposed portion at the outer face extending unbroken from the outer face to the interface of the resist layer, such that the removal of the continuous exposed region leaves the unexposed portion at the outer face as a further remaining resist portion.

19. The method of claim 18, wherein the further remaining resist portion is arranged to act as an alignment marker for use in positioning of the substrate and/or chemical epitaxy template for a subsequent lithographic process step.

20. The method of claim 18, wherein the further remaining resist portion is arranged for use as a graphoepitaxy template, in combination with the chemical epitaxy template, as part of the patterned template for orientation of the self-assemblable block copolymer.

21. The method of claim 18, wherein the further remaining resist portion is exposed to actinic radiation, after removal of the continuous exposed region, to modify the chemical affinity of the further remaining resist portion.

22. A method of forming an ordered block copolymer layer on a surface of a substrate, the method comprising:

providing a surface of a substrate, having a patterned template thereon, the patterned template provided by the method of claim 13;

depositing a self-assemblable polymer layer directly onto the patterned template; and treating the self-assemblable block copolymer layer to provide self-assembly into an ordered block copolymer layer, with the ordering directed by the patterned template.

* * * * *